US006829169B2

(12) United States Patent
Ganivet et al.

(10) Patent No.: US 6,829,169 B2
(45) Date of Patent: Dec. 7, 2004

(54) ELECTRICALLY ERASABLE AND PROGRAMMABLE MEMORY COMPRISING AN INTERNAL SUPPLY VOLTAGE MANAGEMENT DEVICE

(75) Inventors: Filipe Ganivet, Venelles (FR); Francesco La Rosa, Rousset (FR); Thierry Giovinazzi, Aix En Provence (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/420,533

(22) Filed: Apr. 22, 2003

(65) Prior Publication Data

US 2003/0223289 A1 Dec. 4, 2003

(30) Foreign Application Priority Data

Apr. 23, 2002 (FR) .......................................... 02 05041

(51) Int. Cl.[7] .............................................. G11C 16/04
(52) U.S. Cl. .............................. 365/185.18; 365/189.11; 365/175
(58) Field of Search ...................... 365/185.18, 189.11, 365/175, 185.24, 185.29

(56) References Cited

U.S. PATENT DOCUMENTS

| 5,986,947 A | * 11/1999 | Choi et al. ............. 365/189.11 |
| 6,226,224 B1 | 5/2001 | Banba et al. ................ 365/276 |

FOREIGN PATENT DOCUMENTS

| EP | 1113450 | 7/2001 | ........... G11C/16/30 |
| WO | 01/65568 | 9/2001 | ........... G11C/16/08 |

* cited by examiner

Primary Examiner—David Lam
(74) Attorney, Agent, or Firm—Allen, Dyer, Doppelt, Milbrath & Gilchrist, P.A.; Lisa K. Jorgenson

(57) ABSTRACT

An electrically erasable and programmable memory includes an array of memory cells, and a distribution line linked to a receiving terminal of an external supply voltage and to a booster circuit. The distribution line provides an internal supply voltage. The distribution line is also linked to the receiving terminal through a diode or a diode circuit simulating operation of a diode. The memory includes a regulator for triggering the booster circuit when the internal supply voltage becomes lower than a threshold so as to maintain the internal supply voltage close to the threshold when the external supply voltage is too low, at least during the reading of memory cells. The diode or the diode circuit is blocked when the external supply voltage is too low.

30 Claims, 4 Drawing Sheets

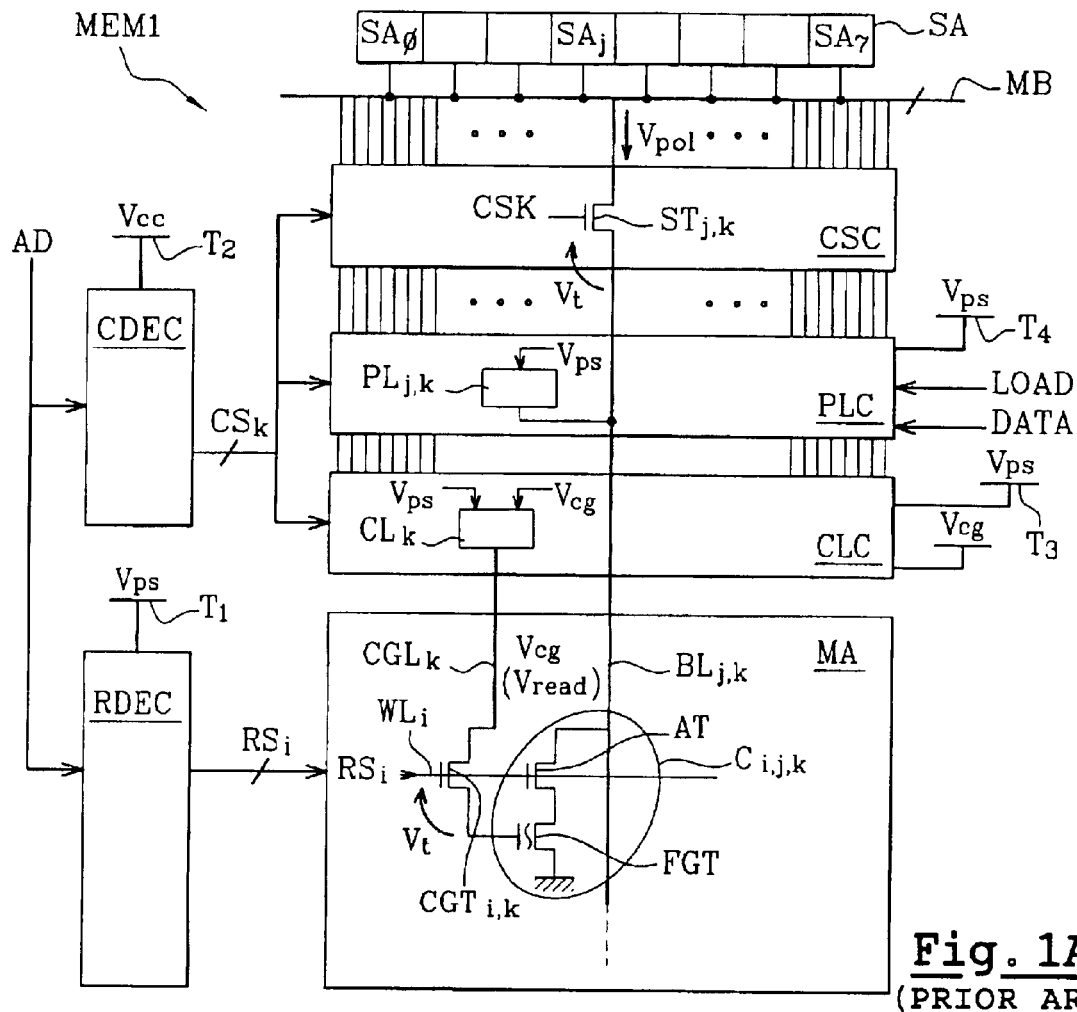
Fig. 1A
(PRIOR ART)
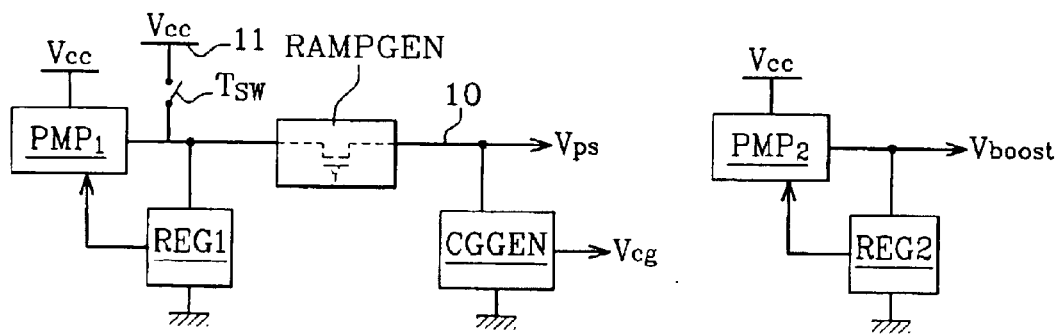
Fig. 1B
(PRIOR ART)
Fig. 1C
(PRIOR ART)

ELECTRICALLY ERASABLE AND PROGRAMMABLE MEMORY COMPRISING AN INTERNAL SUPPLY VOLTAGE MANAGEMENT DEVICE

FIELD OF THE INVENTION

The present invention relates to an electrically programmable and erasable memory comprising a memory array of memory cells, and a distribution line of an internal supply voltage linked to a receiving terminal of an external supply voltage and to a booster circuit. The present invention relates more particularly to the management of the internal supply voltage of this memory, particularly during phases of reading memory cells.

BACKGROUND OF THE INVENTION

An example of the architecture of an electrically erasable and programmable memory is schematically represented in FIG. 1A. The illustrated memory MEM1 comprises a memory array MA in which memory cells $C_{i,j,k}$ are linked to word lines $WL_i$ and to bit lines $BL_{j,k}$ arranged in columns, wherein i is a word line index, k is a column index, and j is a bit line index within a column.

Each memory cell $C_{i,j,k}$ comprises a floating-gate transistor FGT, the drain of which is linked to a bit line $BL_{j,k}$ through an access transistor AT. The gate of the transistor FGT is linked to a gate control line $CGL_k$ through a gate control transistor $CGT_{i,k}$. The gate of the gate control transistor $CGT_{i,k}$ and the gate of the access transistor AT are connected to a word line WLi.

To ensure access to the memory cells for reading and writing, the memory also comprises a line decoder RDEC, a column decoder CDEC, a column lock circuit CLC, a column selection circuit CSC, a programming circuit PLC and a read circuit SA.

The read circuit SA comprises sense amplifiers, such as eight amplifiers SA0 to SA7, for example, if the memory array is made up of eight-bit words. Each amplifier $SA_j$ of rank j is linked, through a multiplexing bus MB, to each bit line $BL_{j,k}$ of the same rank j present in each column of the memory array.

The line decoder RDEC and the column decoder CDEC respectively receive the most significant bits and the least significant bits of an address AD, and respectively deliver I line selection signals $RS_i$ and K column selection signals $CS_k$. After application of an address AD, a line selection signal $RS_i$ out of the I signals $RS_i$ is set to 1 by the line decoder, while the other signals $RS_i$ are equal to 0. Similarly, a column selection signal $CS_k$ out of the K signals $CS_k$ is set to 1 by the column decoder while the other signals $CS_k$ are equal to 0.

From an electrical point of view, a line selection signal $RS_i$ equal to 1 has a voltage level equal to an internal supply voltage Vps applied to a supply terminal T1 of the decoder RDEC. Similarly, a selection signal $CS_k$ equal to 1 has a voltage level equal to an external supply voltage Vcc applied to a supply terminal T2 of the decoder CDEC.

The column selection circuit CSC comprises bit line selection transistors $ST_{j,k}$. Each transistor $ST_{j,k}$ is arranged in series on a bit line $BL_{j,k}$ and allows the bit line to be connected to a sense amplifier $SA_j$. The transistors $ST_{j,k}$ present on bit lines of the same column are driven by the selection signal $CS_k$ of the column considered.

The column lock circuit CLC comprises column selection locks $CL_k$ and receives a gate control voltage Vcg at an input terminal. Each lock $CL_k$ is activated by a column selection signal $CS_k$. Each lock delivers the voltage Vcg to the gate control line $CGL_k$ of the column to which it is assigned, when it is activated by the corresponding signal $CS_k$.

The voltage Vps electrically supplies the column selection locks $CL_k$ and is applied for this purpose to a supply terminal T3 of the circuit CLC. The programming circuit PLC comprises programming locks $PL_{j,k}$ each having an output linked to a bit line $BL_{j,k}$. The locks $PL_{j,k}$ are activated by the selection signals $CS_k$ to load data [DATA] to be programmed, on the basis of one bit per lock, upon reception of a signal LOAD.

The voltage Vps electrically supplies the programming locks $PL_{j,k}$ and is applied for this purpose to a supply terminal T4 of the circuit PLC. The voltage Vps is delivered by a distribution line 10 represented in FIG. 1B, connected to the terminals T1, T3, T4 of the elements described above. The distribution line 10 is linked to a supply terminal 11 of the memory through a switch transistor Tsw that is off (transistor on) during the column selection, programming lock loading and read periods. The voltage Vps is then substantially equal to the voltage Vcc, disregarding the voltage drop in the transistor Tsw.

The distribution line 10 is also linked to the output of a booster circuit PMP1, generally a charge pump, supplied by the voltage Vcc and controlled by a regulator REG1. During phases of erasing and programming memory cells, the switch Tsw is on (transistor blocked) and the charge pump is activated. The charge pump delivers a high voltage Vpp, on the order of 15 to 20 V, that is gradually applied to the line 10 by a ramp generator RAMPGEN comprising a PMOS transistor arranged in series on the line 10. This transistor is represented with dotted lines, as it is transparent from an electrical point of view (it leads to hardly any voltage drop in the line 10) except during the ramp generation periods.

The gate control voltage Vcg is delivered by a circuit CGGEN supplied by the voltage Vps. When the memory is in the read phase and the voltage Vps is equal to Vcc (Tsw on), the voltage Vcg delivered by the circuit CGGEN is equal to a read voltage Vread. When the memory is in the erase phase and the voltage Vps is equal to the high voltage Vpp, the voltage Vcg delivered by the circuit CGGEN is equal to a high erase voltage Verase. Finally, when the memory is in the programming phase and the voltage Vps is equal to the high voltage Vpp, the voltage Vcg delivered by the circuit CGGEN is equal to 0 (ground).

Such a memory is generally required to have technical specifications that are quite wide and fairly unrestrictive for the user as far as the external supply voltage Vcc is concerned, with a tolerance range from 1.6 V to 5.6 V, for example. However, in practice, it emerges that a drop in the voltage Vcc in the lowest values of the tolerance range is capable of leading to a malfunction of the memory during periods of reading memory cells.

For a better understanding, it will be assumed, with reference to FIG. 1A, that a memory cell $C_{i,j,k}$ must be read by an amplifier SAj. A column selection lock $CL_k$ applies the voltage Vcg to the gate control line $CGL_k$. The voltage Vcg is, in this case, equal to Vread and must be found, without attenuation, on the gate of the floating-gate transistor FGT, through the transistor $CGT_{i,k}$. The voltage Vread is between the threshold voltage of the erased transistor and the threshold voltage of the programmed transistor, and enables the sense amplifier $SA_j$ to find out whether the transistor is on (transistor erased, corresponding to the reading of a 1) or blocked (transistor programmed, corresponding to the reading of a 0). It will be assumed that the voltage Vread is on the order of 1.2 V, as is generally the case, and that the tolerance range for the voltage Vcc is 1.6–5.6 V.

So that the voltage Vread reaches, without attenuation, the control gate of the transistor FGT, the gate of the transistor $CGT_{i,k}$ must receive a selection signal $RS_i$ having a voltage level at least equal to Vread+Vt, wherein Vt is the threshold voltage of the transistor $CGT_{i,k}$. Since the voltage level of a selection signal $RS_i$ set to 1 is equal to the voltage Vps applied to the supply terminal T1 of the decoder RDEC, the voltage Vps must be higher or equal to a threshold Vmin1 such that:

$$Vmin1=Vread+Vt,$$

i.e., approximately 2.2 V in the abovementioned example. Yet, the threshold Vmin1 is above the lowest values of the voltage Vps contained in the abovementioned tolerance range.

A similar problem is encountered on the bit line $BL_{j,k}$ during the reading of the cell. The sense amplifier $SA_j$ applies a voltage Vpol to the bit line $BL_{j,k}$ that must be found on the drain of the transistor FGT after passing through a selection transistor $ST_{j,k}$ and the access transistor AT. The access transistor AT must therefore receive a selection signal $RS_i$ at its gate that is at least equal to a threshold Vmin2:

$$Vmin2=Vpol+Vt,$$

wherein Vt is the threshold voltage of the access transistor.

Similarly, the selection transistor $ST_{j,k}$ must receive a selection signal $CS_k$ at its gate that is at least equal to Vmin2, so that the voltage Vcc applied to the decoder CDEC must not be below Vmin2. In fact, providing a wide tolerance range for the supply voltage Vcc implies providing a means for guaranteeing that the internal supply voltage Vps does not drop below the thresholds Vmin1 and Vmin2, and that the voltage Vcc applied to the column decoder does not drop below the threshold Vmin2.

As the voltage Vpol is generally below Vread, such as 1 V for example, the threshold Vmin2 is below the threshold Vmin1. Maintaining a minimum voltage Vmin1 on the decoders RDEC and CDEC is therefore sufficient to guarantee the proper bias of the gates of the access transistor AT and of the selection transistor $ST_{j,k}$.

A classical approach to maintain the internal supply voltage Vps at a sufficient level is represented in FIG. 1C. A booster circuit is provided, generally a charge pump PMP2, which delivers a regulated voltage Vboost. The charge pump PMP2 is controlled by a regulator REG2 and is placed upwards from the distribution line 10, between the supply terminal 11 of the memory and the switch transistor Tsw. The line 10 therefore receives the voltage Vboost instead of the voltage Vcc. The voltage Vboost is also applied to the terminal T2 of the decoder CDEC, instead of the voltage Vcc.

This approach has a disadvantage in that the pump PMP2 constantly consumes current, even when it is not necessary, i.e., when the voltage Vcc is above the threshold Vmin1. Another disadvantage of this approach is that it requires providing two charge pumps, one to deliver the voltage Vpp in the erasing or the programming mode and the other to deliver the voltage Vboost in the read mode.

SUMMARY OF THE INVENTION

In view of the foregoing background, an object of the present invention is to overcome the above listed disadvantages.

This and other objects, advantages and features in accordance with the present invention are achieved by providing an electrically erasable and programmable memory comprising a memory array made up of memory cells, a distribution line of an internal supply voltage linked to a receiving terminal of an external supply voltage and to a booster circuit, and a diode or a diode circuit simulating operation of a diode and linking the distribution line to the receiving terminal. The memory also comprises means for triggering the booster circuit when the internal supply voltage becomes lower than a determined threshold, so as to maintain the internal supply voltage proximate to the threshold when the external supply voltage is too low, at least during the reading of the memory cells. The diode or the diode circuit is blocked.

The determined threshold may be higher than or equal to the sum of a memory cell read voltage and a MOS transistor threshold voltage. The determined threshold may also be higher than or equal to the sum of a drain bias voltage of a memory cell to be read and a MOS transistor threshold voltage.

The memory may further comprise the booster circuit to take the internal supply voltage to a high memory cell erasing or programming voltage, during phases of erasing or programming the memory cells. According to one embodiment, the memory comprises a single booster circuit and a regulator with two operating modes. One operating mode is during phases of erasing or programming the memory cells, during which the internal supply voltage is taken to a high erasing or programming voltage. Another mode is at least during phases of reading the memory cells, wherein the internal supply voltage is maintained proximate to the threshold when the external supply voltage is too low.

The memory may comprise a line decoder having a supply terminal connected to the distribution line. The memory may comprise column selection locks and a column selection lock supply terminal connected to the distribution line. The memory may also comprise programming locks and a programming lock supply terminal connected to the distribution line.

The memory may comprise a column decoder and a column decoder supply terminal that is linked to the distribution line through a first switch that is off at least during phases of reading memory cells, and is linked to the receiving terminal of the external supply voltage through a second switch that is off when the first switch is on.

The diode circuit may comprise a power switch with a low series voltage drop, wherein the anode is linked to the receiving terminal of the external supply voltage and the cathode is linked to the distribution line. There is also means for controlling the power switch, arranged to automatically switch off the power switch when the internal supply voltage is higher than the external supply voltage.

The means for controlling the switch may comprise a differential circuit to compare the external supply voltage, and the internal supply voltage and to deliver a control signal of the power switch so as to switch on the power switch when the internal supply voltage is higher than the external supply voltage, and to maintain the power switch off when the internal supply voltage is substantially equal to the external supply voltage.

The differential circuit may comprise two branches arranged as current mirrors, each comprising at least one PMOS transistor in series with an NMOS transistor. A first branch is biased by the external supply voltage, and a second branch is biased by the internal supply voltage. The control signal of the power switch is taken off at the drain of the PMOS transistor of the branch biased by the internal supply voltage. The power switch may be a PMOS transistor. The booster circuit may be a charge pump.

The present invention also relates to a method for managing an internal supply voltage of an electrically erasable and programmable memory comprising a memory array made up of memory cells, and a distribution line of the internal supply voltage linked to a receiving terminal of an external supply voltage and to a booster circuit. The method comprises a step of linking the distribution line to the receiving terminal through a diode or a diode circuit simulating the operation of a diode, and a step of activating the booster circuit when the internal supply voltage becomes lower than a determined threshold, so as to maintain the internal supply voltage proximate to the threshold when the external supply voltage is too low, at least during the reading of memory cells. The diode or the diode circuit is blocked.

The determined threshold may be higher than or equal to the sum of a memory cell read voltage and a MOS transistor threshold voltage. The determined threshold may also be higher than or equal to the sum of a drain bias voltage of a memory cell to be read and a MOS transistor threshold voltage.

A single booster circuit may be provided to take the internal supply voltage to a high erasing or programming voltage during phases of erasing or programming memory cells and to maintain the internal supply voltage proximate to the threshold when the external supply voltage is too low at least during phases of reading memory cells.

The method may be applied to a memory comprising a column decoder and a column decoder supply terminal, in which the supply terminal of the column decoder is linked both to the distribution line through a first switch that is off at least during phases of reading memory cells, and to the receiving terminal of the external supply voltage through a second switch that is off when the first switch is on.

The diode circuit may comprise a power switch with low series voltage drop, wherein the anode is linked to the receiving terminal of the external supply voltage and the cathode is linked to the distribution line, and means for controlling the power switch. The means is arranged to automatically switch off the power switch when the internal supply voltage is higher than the external supply voltage.

BRIEF DESCRIPTION OF THE DRAWINGS

These and other objects, advantages and features of the present invention shall be explained in greater detail in the following description of a memory comprising a power supply management device according to the present invention, given in relation with, but not limited to the following figures:

FIG. 1A illustrates an architecture of an electrically programmable and erasable memory according to the prior art;

FIG. 1B illustrates one embodiment for managing the internal supply voltage of the memory in FIG. 1A;

FIG. 1C illustrates another embodiment for managing the internal supply voltage of the memory in FIG. 1A;

DETAILED DESCRIPTION OF THE PREFERRED EMBODIMENTS

Figure 2:
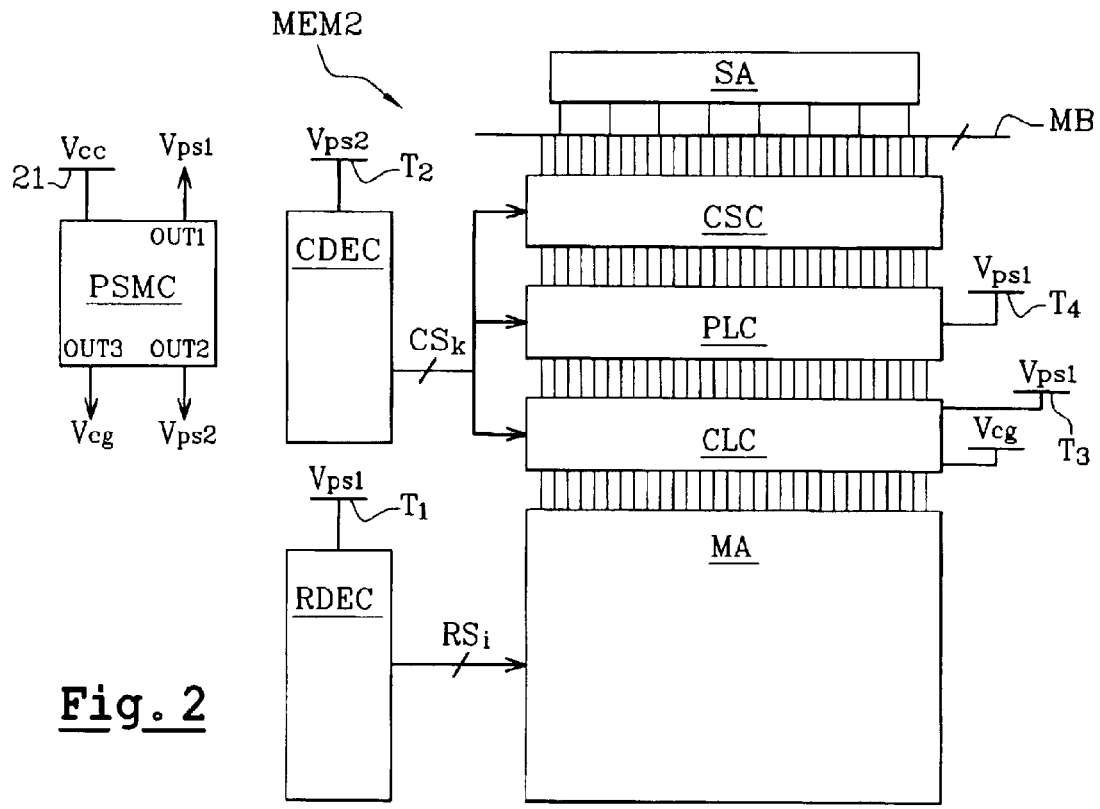
FIG. 2 is a block diagram illustrating an electrically programmable and erasable memory comprising a power supply management device according to the present invention.

FIG. 2 represents an electrically erasable and programmable memory MEM2 comprising a power supply management circuit PSMC according to the present invention. The circuit PSMC comprises an input linked to a supply terminal 21 of the memory, to which an external supply voltage Vcc is applied. It has an output OUT1 linked to a distribution line 20, which delivers an internal supply voltage Vps1 thereto. The circuit PSMC also comprises an output OUT2 delivering a voltage Vps2 and an output OUT3 delivering a gate control voltage Vcg.

Furthermore, the memory MEM2 has a classical architecture and it has the elements already described above, designated by the same references, i.e., the memory array MA, the line decoder RDEC, the column decoder CDEC, the column lock circuit CLC, the column selection circuit CSC, the programming circuit PLC, the read circuit SA and the multiplexing bus MB.

The line decoder RDEC receives the voltage Vps1 at its supply terminal T1, via the line 20. The voltage Vps1 therefore determines the voltage level of a line selection signal RSi set to 1. The column decoder CDEC receives the voltage Vps2 at its supply terminal T2 delivered by the output OUT2 of the circuit PSMC. The voltage Vps2 therefore determines the voltage level of a column selection signal $CS_k$ set to 1.

The voltage Vps1 is also applied to the supply terminal T3 of the column lock circuit CLC and to the supply terminal T4 of the circuit PLC, which are connected to the line 20. The circuit CLC comprises column selection locks (reference FIG. 1A) and also receives the voltage Vcg at another terminal delivered by the output OUT3 of the circuit PSMC. The voltage Vcg is intended to be applied to the gates of the floating-gate transistors of the memory array through the column selection locks and the gate control lines (reference FIG. 1A).

Figure 3:
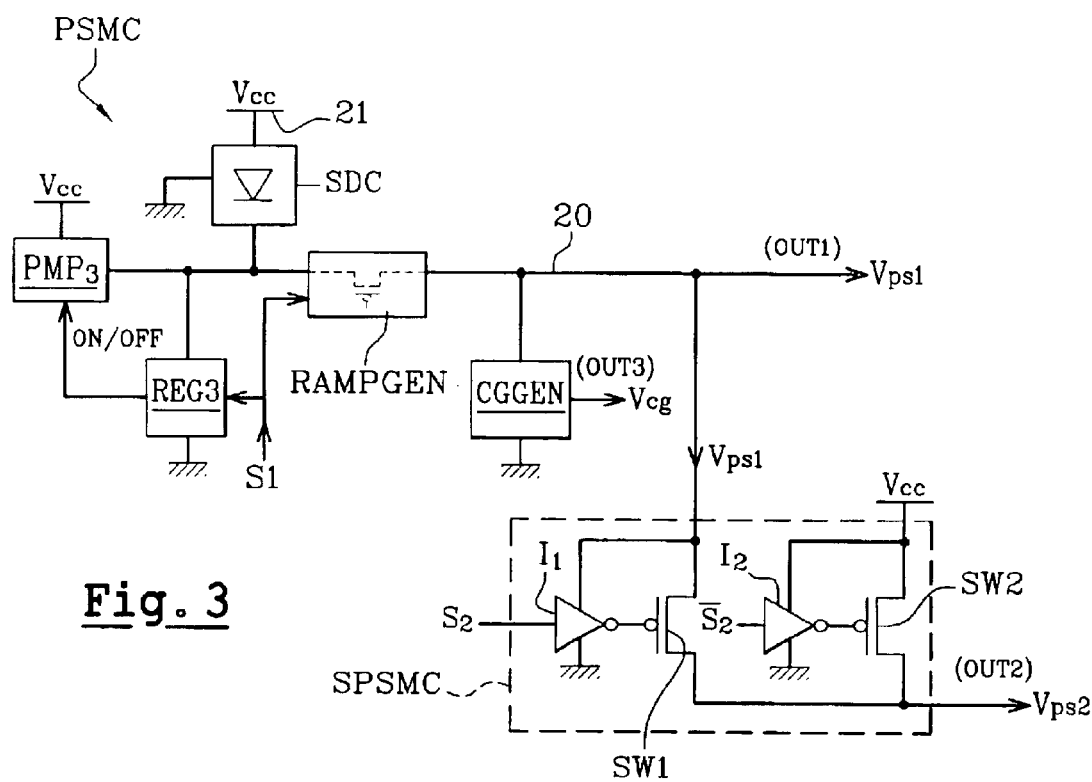
FIG. 3 is a more detailed diagram of the power supply management device illustrated in FIG. 2.

FIG. 3 represents in block form the architecture of the circuit PSMC. A booster circuit can be distinguished, here a charge pump PMP3, the output of which is connected to the distribution line 20. The charge pump PMP3 is controlled by a regulator REG3 which applies a start or stop ON/OFF signal to it. The circuit PSMC also comprises a superdiode circuit SDC comprising an input or anode connected to the terminal 21 receiving the voltage Vcc, and an output or cathode connected to the distribution line 20. The circuit SDC is called a superdiode circuit because it simulates the operation of an ideal diode having a zero threshold voltage. The circuit SDC is therefore in a transmission state when the voltage Vcc is proximate to the voltage Vps1 by higher values, and blocked when the voltage Vcc is below the voltage Vps1.

The voltage Vps2 is delivered by a secondary circuit SPSMC present in the circuit PSMC. The output of the circuit SPSMC forms the output OUT2 of the circuit PSMC, and is therefore connected to the terminal T2 of the column decoder CDEC. The circuit SPSMC comprises a switch SW1 linking the line 20 to the output OUT2, and a switch SW2 having one terminal which receives the external supply voltage Vcc and another terminal which is connected to the output OUT2. The switches are driven by opposite signals S2 and /S2. The switch SW1 is off when the switch SW2 is on, and vice-versa.

As illustrated, the switches are preferably PMOS transistors, so that the voltage drop at the terminals of each switch is zero or almost zero. The signals S2 and /S2 are applied to the gates of the MOS transistors through inverting gates I1 and I2, respectively supplied by the voltage Vps1 and the voltage Vcc and ensuring the adaptation in voltage of the signals S2 and /S2. The voltage Vps2 delivered by the output OUT2 is thus equal to the voltage Vps1 or to the voltage Vcc, depending on the value of the signal S2, and disregarding the voltage drop in the switches SW1, SW2. The gate control voltage Vcg is delivered by a circuit CGGEN that, in itself, is well known to those skilled in the art, the output of which forms the output OUT3 of the circuit PSMC.

The regulator REG3 here has two modes of operation, selected by signal S1. In the first mode of operation, for example when S1=0, the regulator REG3 monitors the voltage Vps1 present on the line 20 and activates the charge pump PMP3 when the voltage Vps1 becomes lower than a threshold Vmin3. The threshold Vmin3 is chosen to be at least equal to if not higher than the highest of the thresholds Vmin1 and Vmin2 described above, below which the voltage Vps1 would be insufficient to provide a smooth operation of the process of reading memory cells.

In the second mode of operation, the regulator REG3 controls the charge pump so that it delivers a high voltage Vpp. The voltage Vpp is gradually applied by a circuit RAMPGEN that is activated by the change to 1 of the signal S1. The circuit RAMPGEN comprises a PMOS control transistor, for example, arranged in series on the line 20, represented by dotted lines and can be considered transparent from an electrical point of view outside ramp generation periods.

Figure 4A:
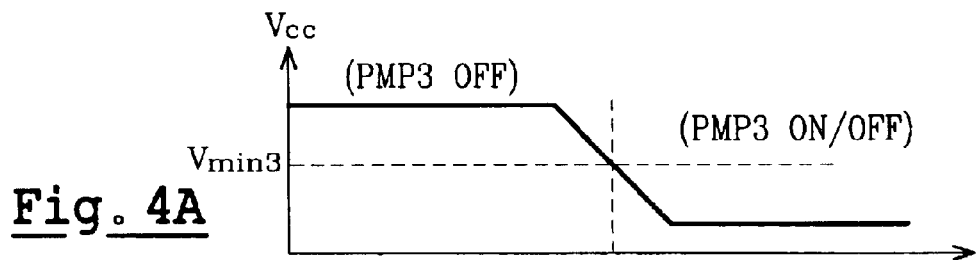
FIGS. 4A and 4B are curves respectively representing an external supply voltage, and an internal supply voltage delivered by the power supply management device according to the present invention.
Figure 4B:
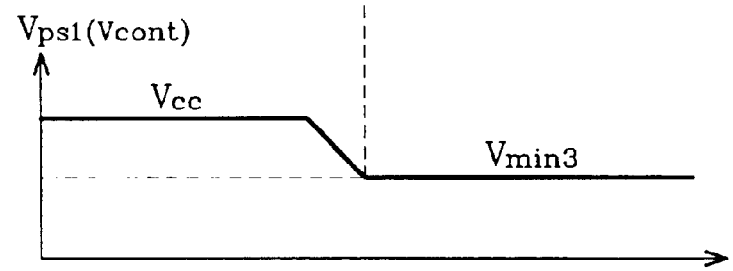

The first operating mode of the circuit PSMC is shown in FIGS. 4A and 4B, which respectively represent the voltage Vcc and the voltage Vps1. When the voltage Vcc is higher than Vmin3, the regulator REG3 applies the signal OFF to the charge pump PMP3 that is inactive (PMP3 OFF), and the superdiode circuit SDC is in transmission state. The voltage Vps1 is therefore substantially equal to the voltage Vcc, disregarding the voltage drop in the circuit SDC, and advantageously the charge pump PMP3 does not consume any current.

When the voltage Vcc drops below Vmin3, the regulator activates the charge pump PMP3 by applying the signal ON. The charge pump then delivers a voltage Vps1 that is adjusted proximate to the voltage Vmin3, by successively stopping and re-starting the charge pump (PMP3 ON/OFF) under the control of the regulator REG3.

The circuit SPSMC prevents the voltage Vps1 from being applied to the column decoder CDEC during the periods of erasing/programming, when the voltage Vps1 is equal to the high voltage Vpp. The signal S2 is then set to 0 and the column decoder is supplied by the voltage Vcc via the switch SW2. Preferably, the signal S2 is set to 1 only during the periods of effective reading of the memory cells, when the voltage Vps2 must be controlled so as to provide a smooth operation of the reading process. The signal S2 can be left set to 0 during periods of loading programming locks, during periods of selecting columns, etc.

TABLE 1 below summarizes operation of the circuit PSMC. Vcont designates the controlled value of the voltage Vps1 outside periods of erasing/programming, when the voltage Vps1 is maintained above the threshold Vmin3, as shown by FIG. 4B.

TABLE 1

|  | S1 | S2 | Vcg | Vps1 | Vps2 |
|---|---|---|---|---|---|
| Preparation steps for writing a word: |  |  |  |  |  |
| Application of an address, selection of a line and a column, loading a word in programming locks . . . | 0 | 0 | 0 | Vcont | Vcc |
| Writing a word: |  |  |  |  |  |
| Erasing the word line | 1 | 0 | Verase | Vpp | Vcc |
| Programming the word | 1 | 0 | 0 | Vpp | Vcc |
| Preparation steps for reading a word: |  |  |  |  |  |
| Application of an address, selection of a line and a column, activation of column selection lock . . . | 0 | 0 | 0 | Vcont | Vcc |
| Reading a word: |  |  |  |  |  |
| Activation of sense amplifiers and application of the read voltage Vread to the cells | 0 | 1 | Vread | Vcont | Vcont |

During reading of the memory cells, the voltage Vcg is equal to a read voltage Vread that is a fraction of the voltage Vps1. During the erasing phases (Vps1=Vpp), the voltage Vcg is equal to a high voltage Verase that is a fraction of the voltage Vpp (Verase is on the order of Vpp minus a voltage drop in the NMOS transistors). During the programming phases, the voltage Vcg delivered by the circuit CGGEN is equal to 0 (ground).

Figure 5:
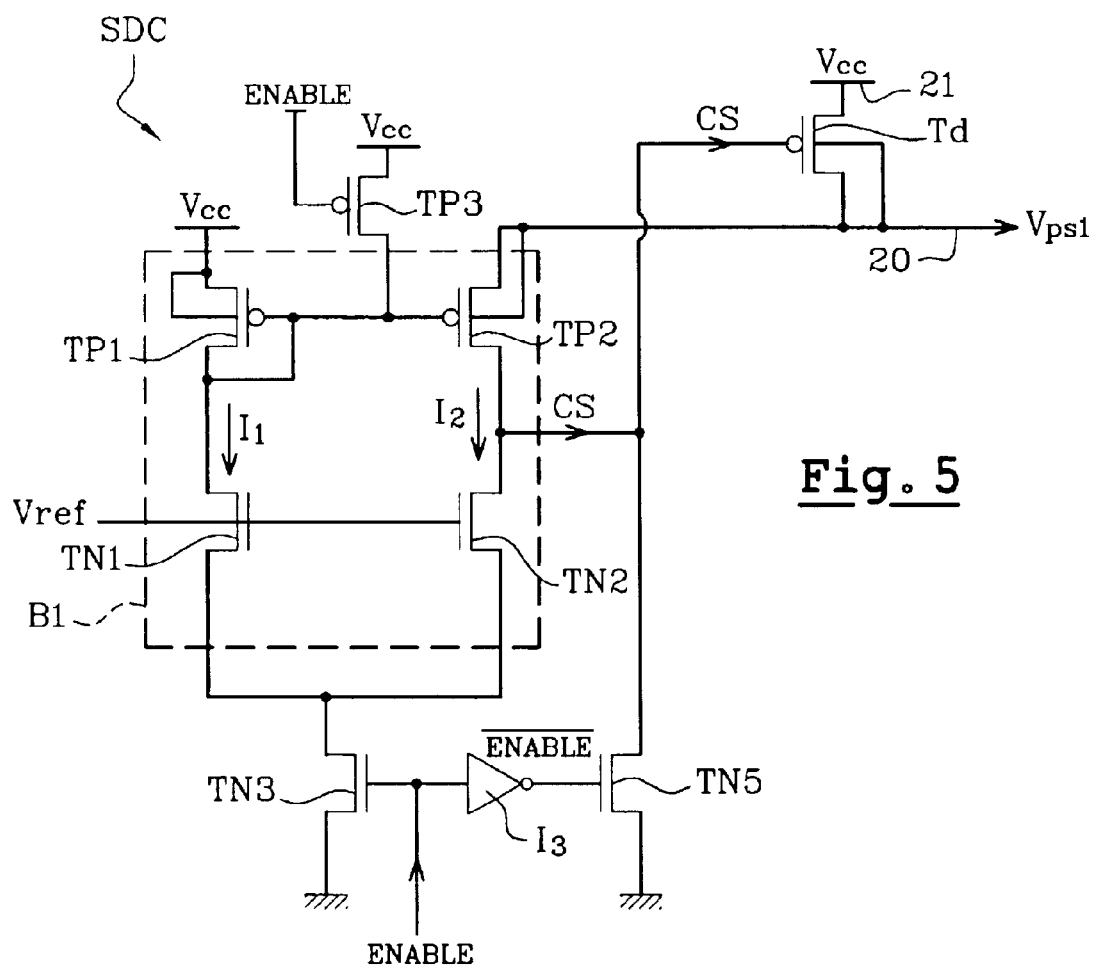
FIG. 5 represents an embodiment the element labeled SDC represented in block form in FIG. 3.

FIG. 5 represents one embodiment of the superdiode circuit SDC. The circuit SDC mainly comprises a transistor Td of the PMOS type, and a control block B1 delivering a control signal CS applied to the gate of the transistor Td. The source of the transistor Td is linked to the supply terminal 21, on which the voltage Vcc is located. The drain and the bulk of the transistor Tp are linked to the distribution line 20, on which the voltage Vps1 is located. When it is on, the transistor Td simulates the superdiode operation described above when the series voltage drop at its terminals is very low, and is only due to its source-drain resistance in the forward direction (Rdson). The control block B1 blocks the transistor Td when the voltage Vps1 is higher than the voltage Vcc, so as to simulate the blocking of a reverse biased diode.

Below, the transistors designated TPn are PMOS transistors and the transistors designated TNn are NMOS transistors, wherein n is a number. The block B1 comprises two branches arranged as current mirrors. The first comprises a transistor TP1 in series with a transistor TN1. The second comprises a transistor TP2 in series with a transistor TN2. The source S and the bulk of the transistor TP1 receive the voltage Vcc. The gate G of the transistor TP1 is connected to the drain D of this transistor and to the gate of the transistor TP2. The drain D of the transistor TP1 is connected to the drain of the transistor TN1, the source of which is linked to ground. The source S and the bulk of the transistor TP2 are connected to the distribution line 20 and thus receive the voltage Vps1. The drain of the transistor TP2 is connected to the drain of the transistor TN2, the source of which is linked to ground. The gates of transistors TN1 and TN2 are biased by a substantially constant voltage Vref that provides currents I1 and I2, which are assumed to be equal in the two branches. The voltage Vref is substantially equal to the threshold voltage of the transistors TN1, TN2 so that the latter operate in a saturated mode (and are, as a result, equivalent to current generators). The control signal CS is taken off at the connection node of the drains of transistors TP2 and TN2.

The circuit SDC optionally comprises a transistor TP3 driven by a signal ENABLE, which links the gates of the transistors TP1, TP2 to the voltage Vcc, and a transistor TN3 driven by the signal ENABLE, which links the sources of the transistors TN1, TN2 to ground. Again optionally, the output node of the block B1 delivering the signal CS is linked to ground through a transistor TN5 having its gate driven by an inverted signal /ENABLE delivered by a gate I3.

When the signal ENABLE is at 0, the transistor TP3 is on and the transistor TN3 is blocked. The transistors TP1 and TP2 receive the voltage Vcc at their gates and are blocked. The transistor TN5 is on and forces the signal CS to 0, so that the transistor Td is on. The voltage Vps1 is not controlled and is permanently equal to Vcc.

The circuit SDC is active when the signal ENABLE is at 1 (Vcc). The block B1 then operates as a sort of differential amplifier comparing the source voltages of the transistors TP1 and TP2, i.e., the voltages Vcc and Vps1. If the charge pump is not activated by the regulator and the voltage Vps1 on the line 20 is proximate to Vcc by lower values, the gate voltage of the transistor TP2 is equal to Vcc-Vt, wherein Vt is the threshold voltage of TP2, while the source of the transistor TP2 receives a voltage proximate to Vcc by lower values, i.e., Vcc-ϵ. The source-gate voltage Vsg of the transistor TP2 is equal to Vt-ϵ and is substantially lower than Vt, such that the transistor TP2 is blocked. As the transistor TN2 is on, the signal CS goes to 0 and maintains the transistor Td on. When the regulator triggers the charge pump (voltage Vcc lower than the threshold Vmin3), the voltage Vps1 becomes higher than Vcc and the source-gate voltage Vsg of the transistor TP2 is higher than its threshold voltage Vt:

$$Vsg=Vps1-(Vcc-Vt)=Vt+(Vps1-Vcc).$$

The transistor TP2 goes into a transmission state and the signal CS rises towards the voltage Vps1, such that the transistor Td is blocked. The switch time of the block B1 is rapid such that the time in which the voltage Vps1 boosted by the charge pump is in short circuit with the voltage Vcc is negligible.

In fact, and as indicated above, the transistor Td controlled by the block B1 operates like an ideal virtual diode, by being on when the voltage Vps1 is proximate to Vcc by lower values and by being blocked when the voltage Vps1 rises under the action of the charge pump. The voltage Vcc is then below Vmin3 (FIGS. 4A, 4B).

Figure 6:
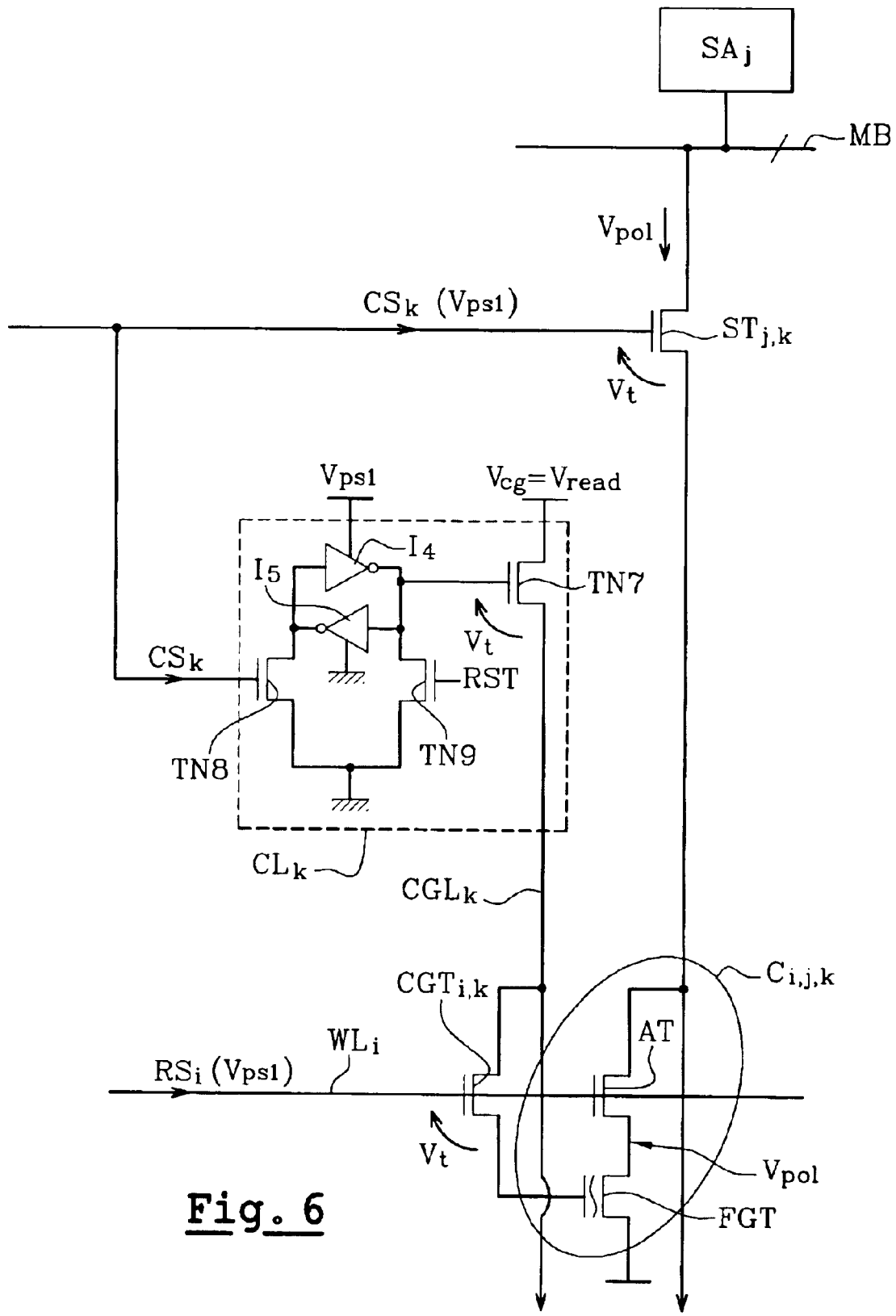
FIG. 6 is a wiring diagram for reading a memory cell in the memory illustrated in FIG. 2.

FIG. 6 illustrates the sequence of the process of reading a memory cell $C_{i,j,k}$ when the voltage Vps1 is equal to the controlled voltage Vcont according to the present invention. A sense amplifier $SA_j$ applies a bias voltage Vpol to a bit line $BL_{i,k}$, through the multiplexing bus MB, a selection transistor $ST_{j,k}$ and an access transistor AT. The transistor AT receives the selection signal $RS_i$ equal to Vps1 at its gate, delivered by the line decoder (not represented). Similarly, the selection transistor $ST_{j,k}$ receives the selection signal $CS_k$ equal to Vps at its gate delivered by the column decoder (not represented). The voltage Vps1 is at least equal to if not higher than the threshold Vmin2=Vpol+Vt. The voltage Vpol is transmitted, without attenuation, to the drain of a floating-gate transistor FGT present in the memory cell $C_{i,j,k}$.

The gate control voltage Vcg, equal to Vread, is applied to the gate of the transistor FGT via a transistor TN7, a gate control line CGLk and a gate control transistor $CGT_{i,k}$. The transistor TN7 is a column lock element CLk comprising a locking means formed by two inverting gates I4, I5 head to foot supplied by the voltage Vps1. The output of the locking means is set to 1 by applying the selection signal $CS_k$ to a transistor TL2, arranged between the input of the locking means and ground.

Therefore, the output of the locking means delivers a gate signal of the transistor TL1 equal to Vps1. The voltage Vps1 is at least equal to if not higher than the threshold Vmin1= Vread+Vt, and the voltage Vread is transmitted without attenuation to the gate control line. Similarly, the transistor $CGT_{i,k}$ receives the selection signal RSi equal to Vps1 at its gate, such that the voltage Vread is transmitted, without attenuation, to the gate of the transistor FGT. When the reading of the transistor is finished, the lock CLk is reset to 0 by applying a signal RST to the gate of a transistor TN9 arranged between the output of the locking means and ground.

Controlling the voltage Vps1 according to the present invention provides a smooth operation of the reading process while offering the advantage of only triggering the charge pump when it is truly necessary, i.e., when the voltage Vcc is below Vmin3, such that the total electrical consumption of the PSMC device is optimal. To truly optimize the electrical consumption of the device PSMC, it is recommended to choose the lowest threshold Vmin3 possible. The minimum value of Vmin3 is equal to the highest threshold out of the two thresholds Vmin1, Vmin2.

It will be understood by those skilled in the art that variations of the present invention may be made. In particular, providing a superdiode circuit according to the present invention allows the triggering of the charge pump to be delayed as much as possible and the external voltage Vcc to be used to a maximum, before it becomes lower than the threshold Vmin3. However, the use of a simple diode that has a non-zero voltage Vdiode at its terminals can also be considered. In this case, the charge pump is triggered when the voltage Vcc becomes lower than a threshold Vmin4=Vmin3+Vdiode, instead of being triggered when the voltage Vcc becomes lower than the threshold Vmin3. In this case, the charge pump is active when the voltage Vcc is between the thresholds Vmin4 and Vmin3, which can lead to current consumption that is substantially higher in applications where the voltage Vcc is often included in this range of values.

Furthermore, although the description above is of a power supply management circuit that advantageously uses a single booster circuit to control the internal supply voltage during the reading of memory cells and to deliver the high voltage Vpp during the erasing and the programming of memory cells, it will be understood that a circuit according to the present invention could comprise two distinct booster circuits.

It will also be understood by those skilled in the art that the present invention is susceptible of being applied to various types of memories, since the memory architecture described above has only been given as an example.

That which is claimed is:

1. An electrically erasable and programmable memory comprising:
   an array of memory cells;
   a booster circuit;

a voltage terminal for receiving an external supply voltage;

a distribution line providing an internal supply voltage to said array of memory cells, said distribution line linked to said voltage terminal and to said booster circuit;

a diode circuit connected between said distribution line and said voltage terminal; and control means for activating said booster circuit when the internal supply voltage becomes lower than a threshold.

2. An electrically erasable and programmable memory according to claim 1, wherein said control means maintains the internal supply voltage close to the threshold when the external supply voltage is too low, at least during reading of memory cells; and wherein said diode circuit is blocked when the external supply voltage is too low.

3. An electrically erasable and programmable memory according to claim 1, wherein the threshold is higher than or equal to a sum of a memory cell read voltage and a MOS transistor threshold voltage.

4. An electrically erasable and programmable memory according to claim 1, wherein the threshold is higher than or equal to a sum of a drain bias voltage of a memory cell to be read and a MOS transistor threshold voltage.

5. An elect ically erasable and programmable memory according to claim 1, wherein said control means activating said booster circuit for taking the internal supply voltage to a high erasing or programming voltage during phases of erasing or programming memory cells.

6. An electrically erasable and programmable memory according to claim 1, further comprising a row decoder connected to said distribution line for receiving the internal supply voltage.

7. An electrically erasable and programmable memory according to claim 1, further comprising a column selection lock circuit connected to said distribution line for receiving the internal supply voltage.

8. An electrically erasable and programmable memory according to claim 1, further comprising a programming lock circuit connected to said distribution line for receiving the internal supply voltage.

9. An electrically erasable and programmable memory according to claim 1, further comprising first and second switches; and a column decoder linked to said distribution line through said first switch that is off at least during phases of reading memory cells, and linked to said voltage terminal through said second switch that is off when said first switch is on.

10. An electrically erasable and programmable memory according to claim 1, wherein said diode circuit comprises:

a power switch including a first terminal linked to said voltage terminal and a second terminal linked to said distribution line; and power switch control means for controlling said power switch by switching off said power switch when the internal supply voltage is higher than the external supply voltage.

11. An electrically erasable and programmable memory according to claim 10, wherein said power switch comprises a PMOS transistor.

12. An electrically erasable and programmable memory according to claim 10, wherein said power switch control means comprise:

a differential circuit for comparing the external supply voltage and the internal supply voltage, for delivering a control signal for switching said power switch when the internal supply voltage is higher than the external supply voltage, and for maintaining said power switch in an off state when the internal supply voltage is substantially equal to the external supply voltage.

13. An electrically erasable and programmable memory according to claim 12, wherein said differential circuit comprises:

first and second branches arranged as current mirrors, each branch comprising at least one PMOS transistor and an NMOS transistor connected in series with said at least one PMOS transistor, each PMOS transistor comprising a drain;

said first branch being biased by the external supply voltage and said second branch being biased by the internal supply voltage, the control signal of said power switch being output from the drain of said at least one PMOS transistor of said second branch.

14. An electrically erasable and programmable memory according to claim 1, wherein said booster circuit comprises a charge pump.

15. A memory comprising:

an array of memory cells; and a power supply management circuit providing an internal supply voltage to said array of memory cells and comprising a charge pump, a distribution line linked to an external supply voltage and to said charge pump, said distribution line providing the internal supply voltage, a diode circuit connected between said distribution line and the external supply voltage, and a control circuit for activating said charge pump when the internal supply voltage becomes lower than a threshold.

16. A memory according to claim 15, wherein said control circuit maintains the internal supply voltage close to the threshold when the external supply voltage is too low; and wherein said diode circuit is blocked when the external supply voltage is too low.

17. A memory according to claim 15, wherein the threshold is higher than or equal to a sum of a memory cell read voltage and a MOS transistor threshold voltage.

18. A memory according to claim 15, wherein the threshold is higher than or equal to a sum of a drain bias voltage of a memory cell to be read and a MOS transistor threshold voltage.

19. A memory according to one claim 15, wherein said charge pump performs the following in response to said control circuit:

taking the internal supply voltage to a high erasing or programming voltage during phases of erasing or programming memory cells; and maintaining the internal supply voltage close to the threshold when the external supply voltage is too low, at least during phases of reading memory cells.

20. A memory according to claim 15, further comprising:

a line decoder connected to said distribution line for receiving the internal supply voltage;

a column selection lock circuit connected to said distribution line for receiving the internal supply voltage; and a programming lock circuit connected to said distribution line for receiving the internal supply voltage.

21. A memory according to claim 15, wherein said power supply management circuit further comprises first and second switches; and further comprising a column decoder linked to said distribution line through said first switch that is off at least during phases of reading memory cells, and linked to the external supply voltage through said second switch that is off when said first switch is on.

22. A memory according to claim 15, wherein said diode circuit comprises:
   a power switch including a first terminal linked to the external supply voltage and a second terminal linked to said distribution line; and
   a differential circuit for controlling said power switch by switching off said power switch when the internal supply voltage is higher than the external supply voltage.

23. A memory according to claim 22, wherein said differential circuit compares the external supply voltage and the internal supply voltage, and delivers a control signal for switching said power switch when the internal supply voltage is higher than the external supply voltage, and maintains said power switch in an off state when the internal supply voltage is substantially equal to the external supply voltage.

24. A memory according to claim 22, wherein said differential circuit comprises:
   first and second branches arranged as current mirrors, each branch comprising at least one PMOS transistor and an NMOS transistor connected in series with said at least one PMOS transistor, each PMOS transistor comprising a drain; and
   said first branch being biased by the external supply voltage and said second branch being biased by the internal supply voltage, the control signal of said power switch being provided at the drain of said at least one PMOS transistor of said second branch.

25. A method for managing an internal supply voltage of a memory comprising an array of memory cells, and a distribution line providing the internal supply voltage, the distribution line being linked to an external supply voltage and to a booster circuit, the method comprising:
   connecting a diode circuit between the distribution line and the external supply voltage;
   activating the booster circuit when the internal supply voltage becomes lower than a threshold so as to maintain the internal supply voltage close to the threshold when the external supply voltage is too low, at least during reading of memory cells; and
   blocking operation of the diode circuit when the external supply voltage is too low.

26. A method according to claim 25, wherein the threshold is higher than or equal to a sum of a memory cell read voltage and a MOS transistor threshold voltage.

27. A method according to claim 25, wherein the threshold is higher than or equal to a sum of a drain bias voltage of a memory cell to be read and a MOS transistor threshold voltage.

28. A method according to claim 25, wherein the activating causes the booster circuit to perform the following:
   taking the internal supply voltage to a high erasing or programming voltage during phases of erasing or programming memory cells; and
   maintaining the internal supply voltage close to the threshold when the external supply voltage is too low, at least during phases of reading memory cells.

29. A method according to claim 25, wherein the memory comprises a column decoder and first and, second switches; and further comprising:
   connecting the column decoder to the distribution line through the first switch that is off at least during phases of reading memory cells; and
   connecting the column decoder to the external supply voltage through the second switch that is off when the first switch is on.

30. A method according to claim 25, wherein the diode circuit comprises a power switch including having a first terminal connected to the external supply voltage and a second terminal connected to the distribution line; and further comprising controlling the power switch by switching off the power switch when the internal supply voltage is higher than the external supply voltage.

* * * * *